(12) United States Patent
Sinclair

(10) Patent No.: US 12,725,758 B2
(45) Date of Patent: Sep. 1, 2026

(54) OBLIQUE ANGLED ION IMPLANTATION FOR SUBSTRATE STRESS CONTROL

(71) Applicant: Applied Materials, Inc., Santa Clara, CA (US)

(72) Inventor: Frank Sinclair, Hartland, ME (US)

(73) Assignee: Applied Materials, Inc., Santa Clara, CA (US)

( * ) Notice: Subject to any disclaimer, the term of this patent is extended or adjusted under 35 U.S.C. 154(b) by 298 days.

(21) Appl. No.: 18/758,499

(22) Filed: Jun. 28, 2024

(65) Prior Publication Data

US 2024/0395500 A1 Nov. 28, 2024

(51) Int. Cl.
*H01J 37/31* (2006.01)
*H01J 37/317* (2006.01)

(52) U.S. Cl.
CPC ................................ *H01J 37/3172* (2013.01)

(58) Field of Classification Search
CPC ................................................. H01J 37/3172
See application file for complete search history.

(56) References Cited

U.S. PATENT DOCUMENTS

2019/0326432 A1* 10/2019 Nakazawa ........... H10D 12/038
2023/0369014 A1* 11/2023 Subrahmanyan ... G03F 7/70783

* cited by examiner

*Primary Examiner* — Nicole M Ippolito
(74) *Attorney, Agent, or Firm* — KDW Firm PLLC

(57) ABSTRACT

A method of stress management in a substrate, using angled ion implantation to introduced anisotropic stress within the substrate.

11 Claims, 6 Drawing Sheets

| Dose (#/cm2) | Tilt Angle | Twist Angle | Post-Pre Residuals |
| --- | --- | --- | --- |
| 1e13, 110keV | 45° | 0 | 1.4um |

| Dose (#/cm2) | Tilt Angle | Twist Angle | Post-Pre Residuals |
| --- | --- | --- | --- |
| 1e12, 110keV | 60° | 90° | 0.44um |

| Dose (#/cm2) | Tilt Angle | Twist Angle | Post-Pre Residuals |
| --- | --- | --- | --- |
| 1e13, 110keV | 60° | 90° | 1.2um |

| Dose (#/cm2) | Tilt Angle | Twist Angle | Post-Pre Residuals |
| --- | --- | --- | --- |
| 1e14, 110keV | 60° | 90° | 1.8um |

OBLIQUE ANGLED ION IMPLANTATION FOR SUBSTRATE STRESS CONTROL

FIELD

The present embodiments relate to stress control in substrates, and more particularly to ion implantation to reduce anisotropic stress in substrates.

BACKGROUND

Devices such as integrated circuits, memory devices, and logic devices may be fabricated on a substrate such as a semiconductor wafer by a combination of deposition processes, etching, ion implantation, annealing, and other processes. Often, complete fabrication of devices and related circuitry may entail many hundreds of operations, including dozens of lithography operations. In particular, lithographic operations may require that a given mask to fabricate structures in a given region or level is to be aligned to preexisting structures.

A resulting problem with fabrication of substrates is the development of out-of-plane distortion (OPD) of the wafer surface that is caused by stresses within the wafer, which distortion may be referred to as warpage. This OPD may be a result of stress that develops within the wafer as a result of the aforementioned fabrication processes. As a result, management of OPD may be critical to achieve proper overlay between structures fabricated at different levels of a device. In particular, the issue of wafer warping during processing of devices on the front of the wafer has become a critical problem for present day device manufacturing where lithography resolution approaches a few nanometers. The wafer can be held flat during lithography by an electrostatic clamp to avoid OPD, but the elastic deformation of the wafer produces an in plane distortion (IPD) that causes image placement errors.

In many cases, the surface of warped wafers are, to a good approximation, spherical in shape (either domed or cupped), in a manner such that the OPD deformation of substrates can be reduced or eliminated by depositing a PECVD film on a back surface of the wafter, followed by a calibrated uniform implant into the PECVD film In other cases, a substrate may exhibit an anisotropic stress that generates more complex patterns of OPD in a substrate. In some examples, the amount of doming or OPD varies locally from one location on the wafer to another. In such cases the complex patterns of OPD may be accommodated by a performing a deliberately non-uniform implant over the face of the wafer. For example, processes have been developed to reduce OPD/IPD by directing a non-uniform ion dose pattern over a substrate to selectively relax the stress in local areas across the substrate surface, and thus reduce OPD in areas of the substrate as needed. In some cases, most notably in the processing of multilayer NAND chips, the original distortion is much more cylindrical than spherical. This distortion is caused by the deep parallel trenches that are etched to form the bitline contacts to the individual data storage cells.

Note that in some approaches to address non-uniform or complex patterns of OPD, the combinations of processes including non-uniform ion implantation may be rather complex and time consuming.

With respect to these and other considerations the present embodiments are provided.

BRIEF SUMMARY

In one embodiment, a method is provided. The method may include providing a substrate on a platen that defines a substrate plane, wherein the substrate defines an initial out-of-plane distortion (OPD) pattern. The method may further include directing an angled implantation process to a substrate surface of the substrate, wherein a group of ions of the ion beam impinge on the substrate along a beam trajectory that defines a non-zero angle of incidence with respect to a normal to the substrate plane. As such, the OPD pattern may be altered after the angled implantation

DETAILED DESCRIPTION

Figure 1:
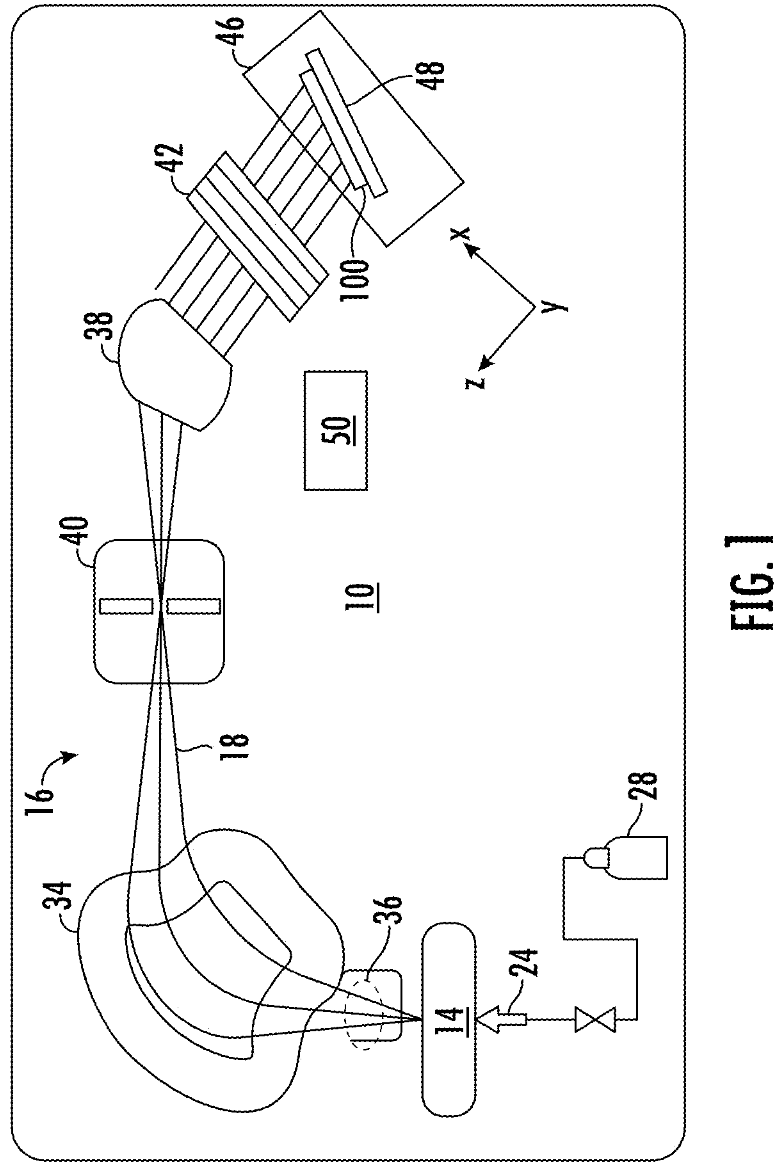
FIG. 1 shows an exemplary system in accordance with the present disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein relate to techniques and apparatus for improved substrate stress management. The present embodiments present an approach that employs oblique ion implantation into a substrate to manage stress in the substrate, such as anisotropic stress.

Referring now to FIG. 1, an exemplary system in accordance with the present disclosure is shown. The ion implantation system (hereinafter "system") 10 represents a process chamber containing, among other components, an ion source 14 for producing an ion beam 18, an ion implanter, and a series of beam-line components 16. The ion source 14 may comprise a chamber for receiving a flow of gas 24 and generating ions therein. The ion source 14 may also comprise a power source and an extraction electrode assembly disposed near the chamber. The beam-line components 16 may include, for example, a mass analyzer 34, a first acceleration or deceleration stage 36, a collimator 38, a mass resolving slit 40, and other suitable downstream beamline components such as an energy filter 42, to accelerate the ion beam 18, decelerate the ion beam 18, shape the ion beam 18, scan the ion beam 18, and so forth.

In particular embodiments, the beam-line components 16 may filter, focus, accelerate, decelerate, and otherwise manipulate ions or the ion beam 18 to have a desired species, shape, energy, and other qualities. The ion beam 18 passing through the beam-line components 16 may be directed toward a substrate mounted on a platen or clamp within a process chamber 46. As appreciated, the substrate may be moved in one or more dimensions (e.g., translate, rotate, and tilt). As shown, there may be one or more feed sources 28 operable with the chamber of the ion source 14.

In various embodiments, different species may be used as the ions to be used to process the stress in the film. Non-limiting examples of suitable ions include argon, neon, xenon, silicon (Si), boron (B), carbon (C), oxygen (O), germanium (Ge), phosphorus (P), arsenic (As), and so forth as to control substrate stress.

Although non-limiting, the ion source 14 may include a power generator, plasma exciter, plasma chamber, and the plasma itself. The plasma source may be an inductively-coupled plasma (ICP) source, toroidal coupled plasma source (TCP), capacitively coupled plasma (CCP) source, helicon source, electron cyclotron resonance (ECR) source, indirectly heated cathode (IHC) source, glow discharge source, electron beam generated ion source, or other plasma sources known to those skilled in the art.

The ion source 14 may generate the ion beam 18 for processing a substrate. In various embodiments, the ion beam (in cross-section) may have a targeted shape, such as a spot beam or ribbon beam, as known in the art. In the Cartesian coordinate system shown, the direction of propagation of the ion beam 18 may be represented as parallel to the Z-axis, while the actual trajectories of ions with the ion beam 18 may vary. In order to process the substrate, the ion beam 18 may be accelerated to acquire a target energy by establishing a voltage (potential) difference between the ion source 14 and the wafer (substrate). As further shown in FIG. 1, the system 10 may include a controller 50 to control operation of various components of the system 10, including components to scan the platen, to tilt the platen, to scan the ion beam 18, or to adjust the energy of the ion beam 18, for example.

The present inventor has discovered that, by implanting a substrate at an oblique angle (referred to herein also as "angled ion implantation" or an "angled ion implant" or "angled implantation"), an anisotropic stress may be introduced into the substrate. The term "angled ion implantation" refers to an implant process where the trajectories of implanting ions form a non-zero angle with respect to a normal to a main plane of a substrate being implanted, such as the front surface or back surface of a wafer. Note that for the purposes of clarity of explanation, an oblique angle will refer to any non-zero angle of ion trajectories with respect to a normal to the local surface of a substrate, whether or not the substrate is entirely planar across the entire substrate.

This phenomenon of generating anisotropic stress within a substrate using angled ion implantation may be understood by examining the results of Monte Carlo computer simulation of ion tracks that are introduced into a solid target as a result of angled ion implantation. In several experiments, the software SRIM-2013 developed by Ziegler and Biersack (2013) was used to simulate collision cascades induced by angled ion implantation.

Figure 2B:
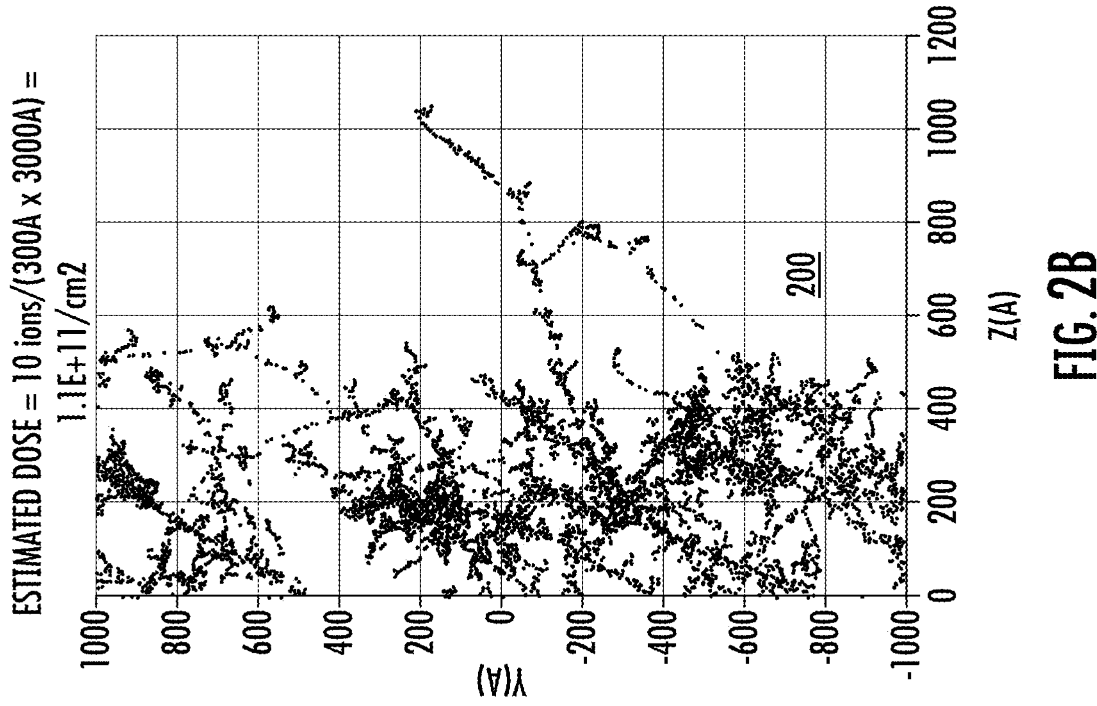
FIG. 2A, FIG. 2B, FIG. 2C, and FIG. 2D collectively show a series of simulations of ion tracks and the associated collision cascades induced by $^{132}$Xe ion implantation into a $Si_3N_4$ layer.
Figure 2A:
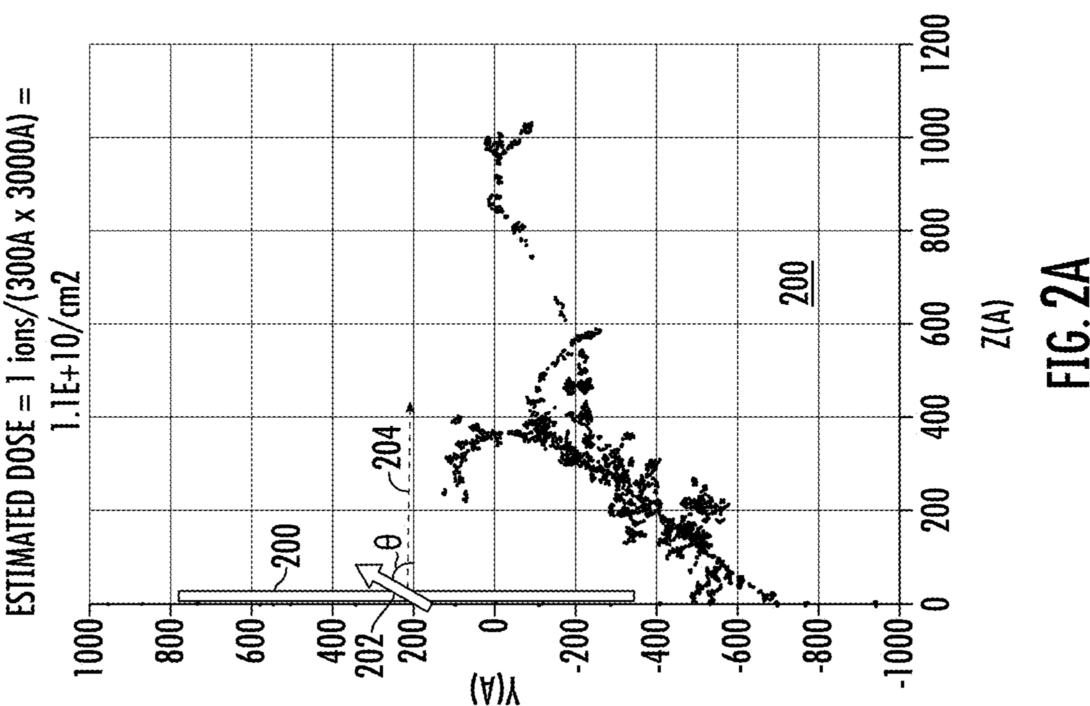
Figures 2C, 2D:
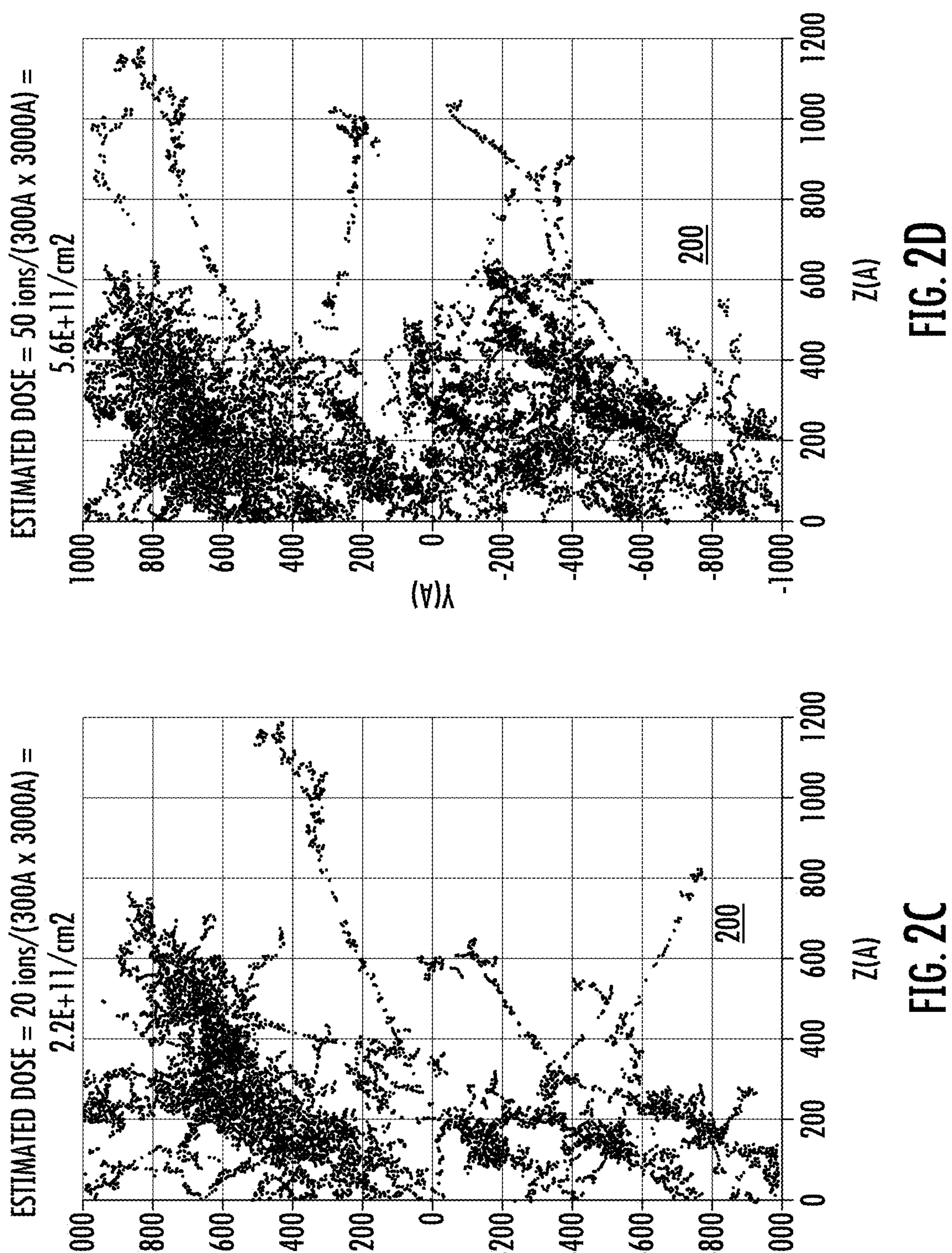

In particular, FIG. 2A, FIG. 2B, FIG. 2C, and FIG. 2D collectively show a series of simulations of ion tracks and the associated collision cascades induced by of 200 keV 132Xe ion implantation into a Si3N4 layer at a 60° implant angle. The graphs of FIGS. 2A-2D present the displaced atoms (whether silicon atoms or nitrogen atoms) within the implanted layer that always decorate the implanting Xe ion trajectories. In FIG. 2A in particular, the macroscopic geometry of the ion implantation process is illustrated, where the solid arrow represents the trajectory of the Xe ions 202 in an ion beam that is incident on a wafer surface with the topmost layer being a layer 200, in this case a silicon nitride (SiN) layer that is 1200 A thick. The dashed arrow represents the normal 204 to the surface of the layer 200, such that the Xe ion trajectory form an angle q of 60 degrees with respect to the normal 204. In FIG. 2A, the results are shown for just one Xe ion implanting into the silicon nitride layer over the area shown, while the results for 10 Xe ions, 20 Xe ions, and 50 Xe ions are shown in FIG. 2B, FIG. 2C, and FIG. 2D, respectively.

The graphs present a two dimensional representation of the ion implantation process, with the Y-axis representing the distance along the surface of the silicon nitride layer, and the Z-axis representing the depth along the normal 204 below the surface of the silicon nitride layer. The simulations shown may be equated to a macroscopic implant dose, where the one-ion simulation of FIG. 2A is equivalent to 1.1E10/cm2, the 10-ion simulation in FIG. 2B is equivalent to 1.1E11/cm2, etc.

As evident, at very low dose, each Xe ion track is marked by a series of displaced atoms lying substantially along a line. Because the Xe ion is more massive (132 amu) than the target atoms of Si (28 amu) or N (14 amu), the Xe atom will typically not suffer a large angle scattering and thus continues most often along its original direction (trajectory). In some statistically rare events the Xe projectile atom suffers a head on collision and shows a large angle change in its trajectory, but the vast majority of damage tracks are substantially aligned with the incident angle. The simulation also tracks occasional high energy secondary ions that are produced when the incident Xe ion knocks a target atom and imparts into the target atom sufficient kinetic energy such that the target atom also produces a trail of displaced atoms. These secondary tracks are often at a large angle with respect to the original Xe ion direction, but are characterized by a lower density of collisions, because the target atom projectile (in this case Si or N) has a lower mass and a lower linear energy transfer. The total number of displaced atoms in the silicon nitride layer is about 3,000 for each incident Xe ion.

As can be seen in these simulations, the net effect of an angled ion implantation process is to generate a set of filamentary structures or threads where the crystal structure of the target film has been significantly altered by the passage of the high energy ion. At moderate doses (a few E11/cm2), most of the silicon nitride layer is completely unaffected In a layer of silicon nitride ($\rho$=3.2 g/cm$^3$), 600 A thick there are about 2.5E17 silicon atoms/cm2 and about 3.3E17 nitrogen atoms/cm2, so that at a dose of 1E11/cm2 and a multiplier of 3,000, the fraction of target atoms displaced is approximately $$f = \frac{3{,}000 \times 1E11}{6E17} = 5E-4$$

or about 0.05% (note that while the graphs depict a fair density of dots representing displaced atoms, in a given square of the graphs, there are on the order of 40,000 undisplaced atoms, thus forming the vast majority of the lattice sites at implant doses in the E11/cm2 range) Since these filaments are inclined at an angle that on average is the same as the angle of incidence of the ions, the mechanical effect on the film is anisotropic and maintains the information about the angle of incidence of the ions. Said differently, the displacement of atoms that takes place along a filament will relax the internal stresses within a layer along that filament. Thus, the stress relaxation will not be uniform in all directions within the layer, but will be determined by the angle of the filaments. At high doses (>≈1E14/cm$^2$), all these damage tracks overlap, the fraction of displaced target atoms approaches unity and the film is eventually made amorphous, at which point the mechanical effect of ion implantation on the stress state in the substrate once again becomes isotropic.

In accordance with the above results, the present embodiments employ angled ion implantation to purposively induce an anisotropic stress across a main surface of a substrate, such as across a main surface of a semiconductor wafer. In various embodiments, the angled ion implantation may counteract an existing anisotropic stress in a substrate, so as to reduce or eliminate a pattern of out of plane distortion (OPD).

FIG. 3A, FIG. 3B, FIG. 3C, and FIG. 3D collectively show the results of experiments that were conducted to implement angled ion implantation for controlling stress according to embodiments of the disclosure. In each of these experiments 110 keV Xe ions were implanted into a $Si_3N_4$ layer, where the angle of incidence (θ) with respect to normal to the substrate plane (X-Y), the ion dose, and the twist angle (angle of ion beam with respect to a defined X-Z plane of the substrate, based on a flat) are varied.

Figures 3A, 3B:
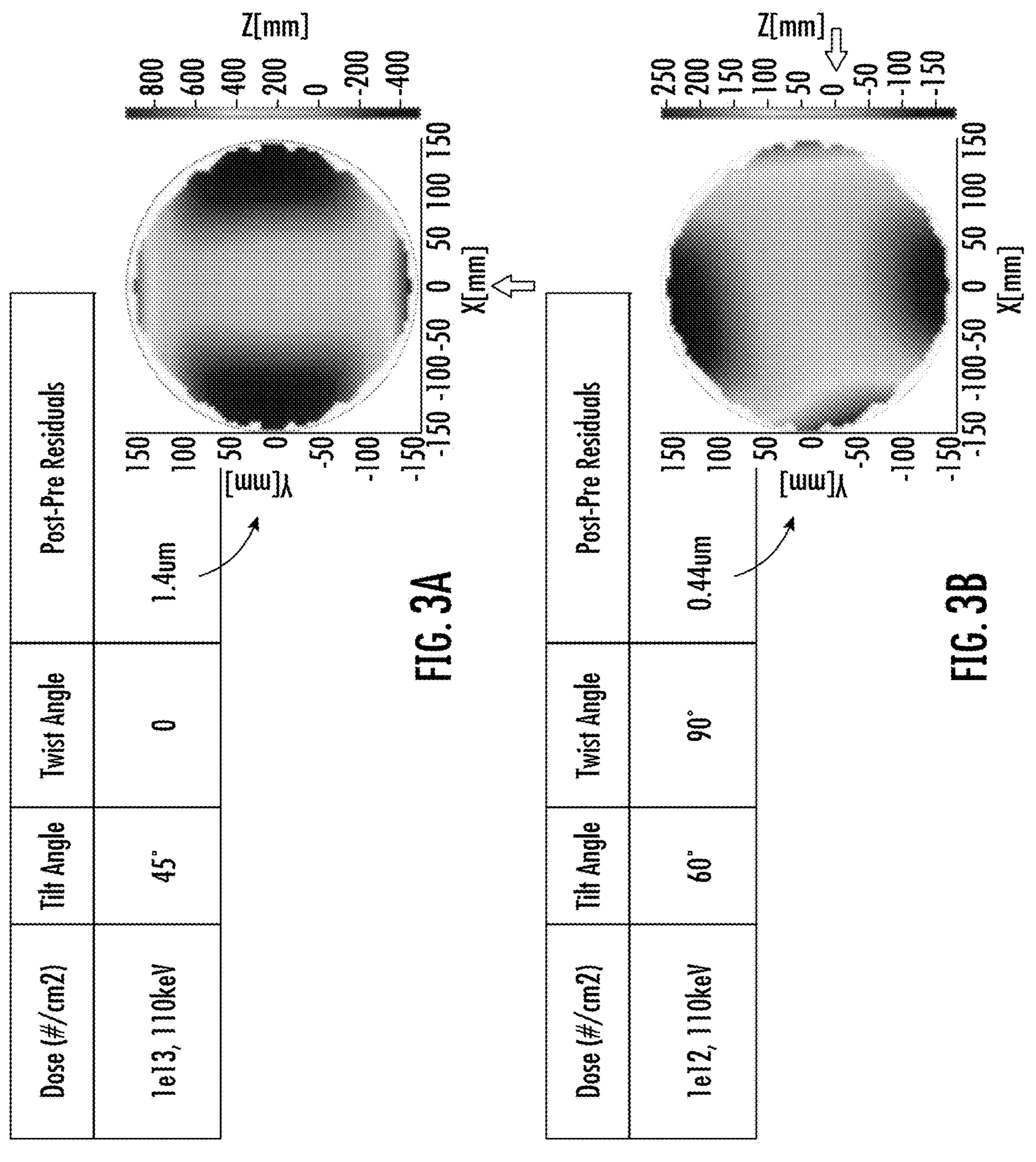
FIG. 3A, FIG. 3B, FIG. 3C, and FIG. 3D collectively show the results of experiments conducted to implement angled ion implantation for controlling stress according to embodiments of the disclosure.

In each of the figures, a table and wafer map are shown, representing the experimental implant conductions, and resulting substrate OPD after implant for a given Xe angled ion implantation. In FIG. 3A, a dose of 1E13/$cm^2$ ions was implanted at a tilt angle (θ) of 45 degrees and twist angle of 0 degrees. The direction of the implanting ion beam in top view is shown by the arrow. The resulting wafer map shows the anisotropic measured OPD in the substrate after implantation, with the uniform spherical OPD of the substrate subtracted out. As illustrated, a systematic, two-dimensional OPD pattern is introduced into the substrate, where the substrate is warped upwardly from a zero plane at the top and bottom as is warped downwardly on both left and right sides. The total maximum warpage in this case is 1.4 μm.

In FIG. 3B, a dose of 1E12/$cm^2$ ions was implanted at a tilt angle (θ) of 45 degrees and twist angle of 90 degrees (note the arrow indicates that direction of the ion beam in this case is from the left). The resulting wafer map shows the anisotropic measured OPD in the substrate after implantation, with the uniform spherical OPD of the substrate subtracted out. As illustrated, a systematic, two-dimensional OPD pattern is again introduced into the substrate. In this case, because the substrate is rotated at a 90 degree twist angle, the substrate is warped downwardly from a zero plane toward the top and bottom as is warped upwardly toward both left and right sides. Because the ion dose is one order of magnitude less than the dose of FIG. 3A, the total maximum warpage is less, 0.44 μm.

Figures 3C, 3D:
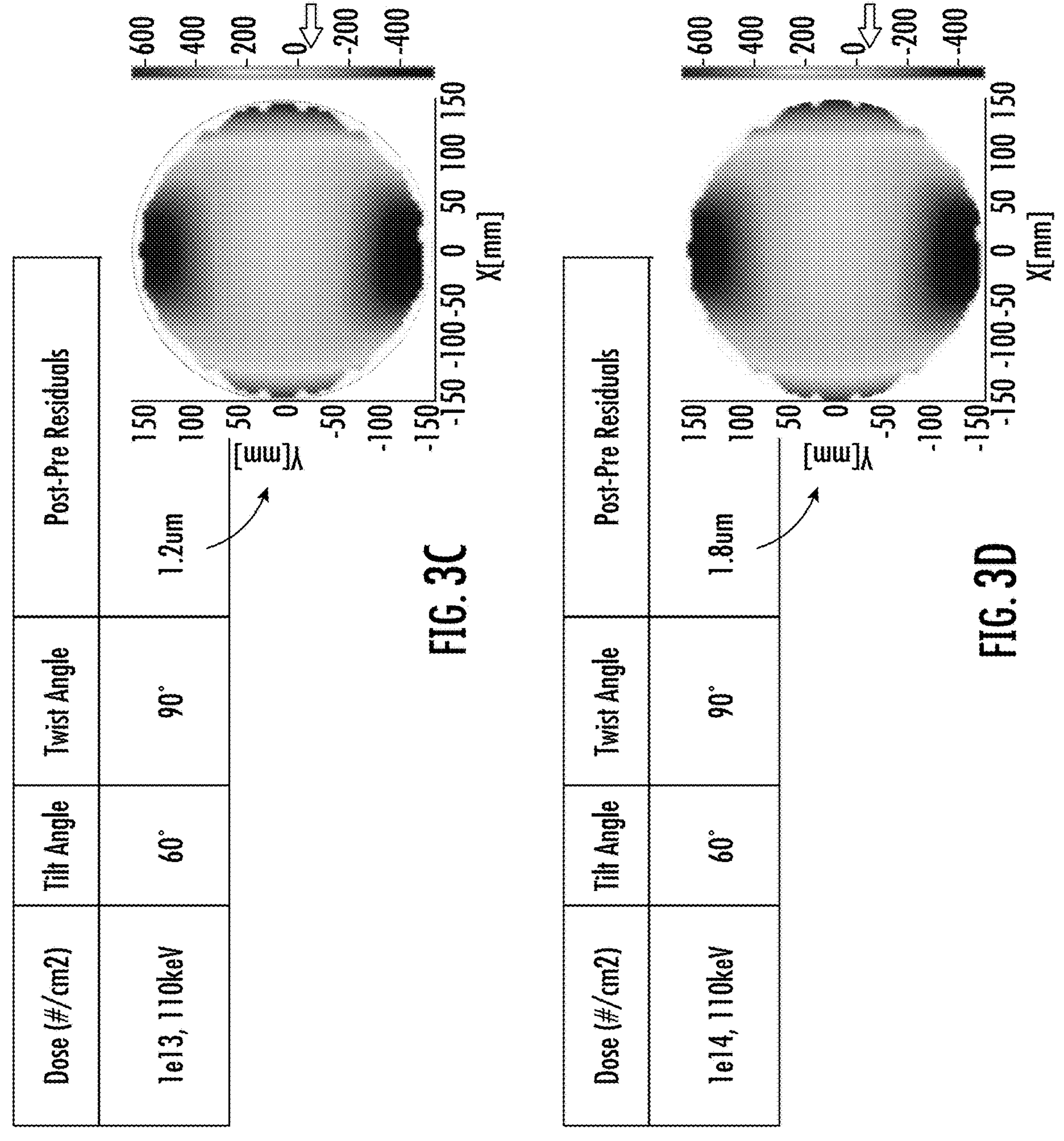

In FIG. 3C, a dose of 1E13/$cm^2$ ions was implanted at a tilt angle (θ) of 60 degrees and twist angle of 90 degrees. The resulting wafer map shows the anisotropic measured OPD in the substrate after implantation, with the uniform spherical OPD of the substrate subtracted out. As illustrated, a systematic, two-dimensional OPD pattern is again introduced into the substrate. In this case, because the substrate is rotated at a 90 degree twist angle, the pattern of substrate warpage is similar to the pattern of FIG. 3B, where the substrate is warped downwardly from a zero plane toward the top and bottom as is warped upwardly toward both left and right sides. Because the ion dose is one order of magnitude higher than the dose of FIG. 3B, the total maximum warpage is greater, 1.2 μm.

In FIG. 3D, a dose of 1E14/$cm^2$ ions was implanted at a tilt angle (θ) of 60 degrees and twist angle of 90 degrees. The resulting wafer map shows the anisotropic measured OPD in the substrate after implantation, with the uniform spherical OPD of the substrate subtracted out. As illustrated, a systematic, two-dimensional OPD pattern is again introduced into the substrate. In this case, because the substrate is rotated at a 90 degree twist angle, the pattern of substrate warpage is similar to the pattern of FIG. 3B, and FIG. 3C, where the substrate is warped downwardly from a zero plane toward the top and bottom as is warped upwardly toward both left and right sides. Because the ion dose is one order of magnitude higher than the dose of FIG. 3C, the total maximum warpage is greater, 1.8 μm.

As can be seen in all the results of FIGS. 3A-3D, the change in shape of the wafer is exactly as would be expected from a linear anisotropic stress, and in each case, the wafer OPD pattern follows the expected pattern based upon the orientation of the angled implant. The effect on total maximum warpage is seen to increase with increasing ion dose, but saturates at approximately 1E14/$cm^2$ at a level of approximately 1.8 μm.

In accordance with further embodiments of the disclosure, this maximum warpage may be further increased by using a higher energy for implanting ions, or a larger mass for the implanted ion, for example.

Figure 4:
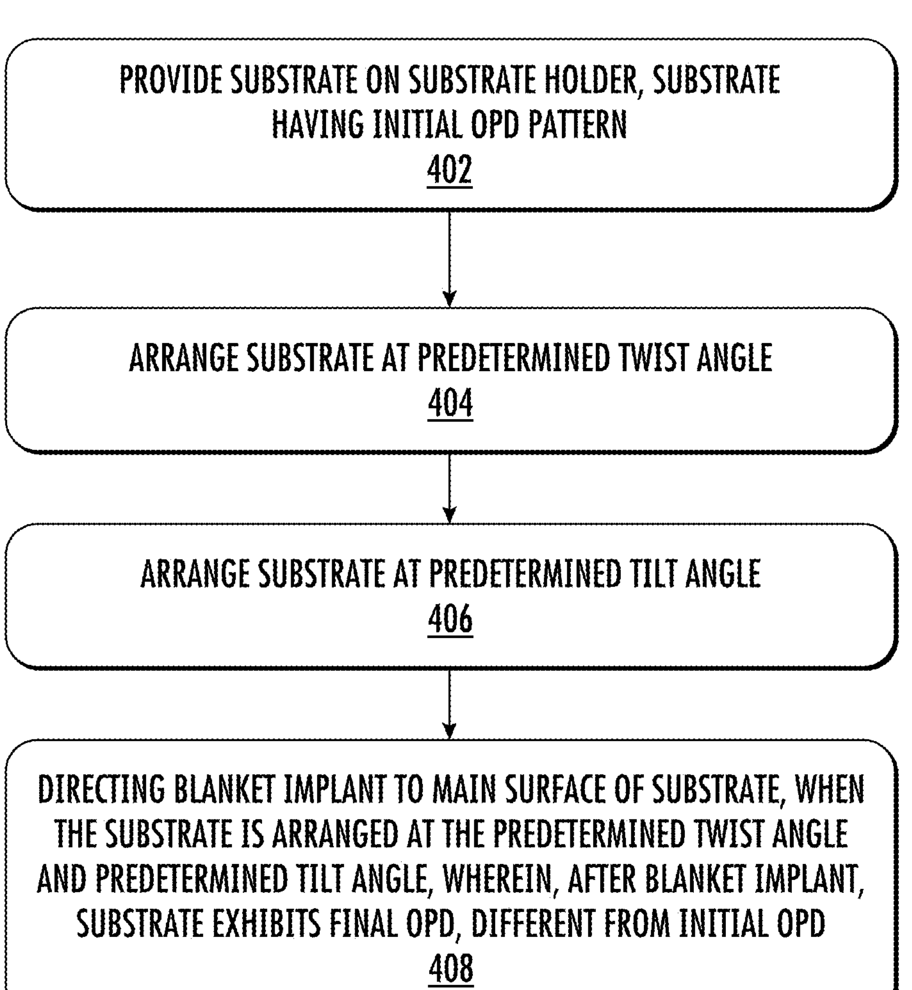
FIG. 4 shows an exemplary process, according to embodiments of the disclosure.

FIG. 4 shows an exemplary process 400, according to embodiments of the disclosure. At block 402, a substrate is arranged on a substrate holder in an ion implantation system. The substrate may exhibit an initial pattern of OPD that is caused, for example, by stress due to the formation of layers on the substrate, and/or patterned structures formed on the substrate. In some examples, the initial pattern of OPD may be a complex, two-dimensional pattern of OPD.

At block 404, the substrate is arranged at a predetermined twist angle, for example, by rotating the substrate holder as needed.

At block 406, the substrate is arranged at a predetermined tilt angle, for example, by tilting the substrate. The tilt angle may be such that the normal to a main plane of the substrate defines a non-zero angle with respect to a beam trajectory for ion beams directed to the substrate holder in the ion implantation system.

At block 408, a blanket implant is directed to a main surface of the substrate, when the substrate is arranged at the predetermined twist angle and the predetermined tilt angle, wherein, after the blanket implant, the substrate exhibits a final OPD, different from the initial OPD. In some examples, the maximum value of the final OPD may be less than the initial OPD. In some examples, the blanket implant may generate an anisotropic stress within the substrate that counteracts an existing anisotropic stress in the substrate that is responsible for the initial OPD.

Besides a blanket treatment of the entire substrate at one dose and one tilt angle and one twist, it may be desirable to modulate an angled implant to correct for more complicated wafer distortions. This might take the form of varying the dose for different areas of the wafer at fixed tilt and twist angles, or using multiple tilt and/or twist angles with different dose patterns. Other possibilities with dynamically varying angles or scan speeds during the implant are also possible.

Advantages provided by the present embodiments are multifold. As a first advantage, a desired anisotropic stress may be induced in a substrate in a simple manner using angled ion implantation. In particular, the anisotropic stress may be introduced in a blanket angled ion implantation, where the substrate is exposed to an angled ion beam in a uniform manner that does not require a patterned implant. As an additional advantage, existing anisotropic warpage or OPD in a substrate may be reduced by using angled ion implantation to introduce a countering anisotropic stress within the substrate.

The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of stress management in a substrate, comprising:

providing a substrate on a platen that defines a substrate plane, wherein the substrate defines an initial out-of-plane distortion (OPD) pattern; and directing an angled implantation process to a substrate surface of the substrate, wherein a group of ions of an ion beam impinge on the substrate along a beam trajectory that defines a non-zero angle of incidence with respect to a normal to the substrate plane, and wherein the OPD pattern is altered after the angled implantation process.

2. The method of claim 1, wherein the OPD pattern is selectively altered so as to reduce a total OPD in the substrate.

3. The method of claim 1, wherein the angled ion implantation process introduces an anisotropic stress within the substrate plane, wherein the OPD pattern is changed in an anisotropic manner across the substrate plane, as a result of the angled implantation process.

4. The method of claim 1, wherein a value of OPD on the substrate surface changes in a positive direction at opposing locations of the substrate surface that lie along an axis parallel to a projection of the beam trajectory, and wherein a value of OPD on the substrate surface changes in a negative direction opposing locations of the substrate surface that lie along an axis perpendicular to a projection of the beam trajectory.

5. The method of claim 1, wherein the non-zero angle of incidence has a value between 30 degrees and 75 degrees.

6. The method of claim 1, wherein an ion dose of the angled implantation process is between 1E11/$cm^2$ and 1E15/$cm^2$.

7. The method of claim 1, wherein an ion energy of the angled implantation process is between 50 keV and 1 MeV.

8. The method of claim 1, wherein an ion mass of the group of ions is greater than a mass of elements that form the substrate.

9. The method of claim 1, wherein an outer layer is disposed on the substrate surface, the outer layer being a SiN material.

10. The method of claim 1, where a dose of the angled implantation is intentionally varied across the surface of the substrate to modulate an amount of anisotropic stress applied to different areas across the surface.

11. The method of claim 1, where a value of the non-zero angle of incidence of the angled implantation is intentionally varied across the surface of the substrate to modulate the stress applied to different areas across the surface.

* * * * *